US012618712B2

(12) United States Patent
Kalogerakis

(10) Patent No.: US 12,618,712 B2
(45) Date of Patent: May 5, 2026

(54) DIFFERENTIAL TRANSIMPEDANCE AMPLIFIER FROM A SINGLE PHOTODIODE

(71) Applicant: NVIDIA Corporation, Santa Clara, CA (US)

(72) Inventor: Georgios Kalogerakis, Pleasanton, CA (US)

(73) Assignee: NVIDIA Corporation, Santa Clara, CA (US)

( * ) Notice: Subject to any disclaimer, the term of this patent is extended or adjusted under 35 U.S.C. 154(b) by 245 days.

(21) Appl. No.: 18/485,057

(22) Filed: Oct. 11, 2023

(65) Prior Publication Data

US 2025/0123143 A1     Apr. 17, 2025

(51) Int. Cl.
  G01J 1/44        (2006.01)
  H03F 3/45        (2006.01)

(52) U.S. Cl.
  CPC ............ G01J 1/44 (2013.01); H03F 3/45475 (2013.01); G01J 2001/446 (2013.01); H03F 2203/45288 (2013.01); H03F 2203/45581 (2013.01)

(58) Field of Classification Search
  CPC ... G01J 1/44; G01J 2001/446; H03F 3/45475; H03F 2203/45288; H03F 2203/45581; H03F 3/087
  See application file for complete search history.

(56) References Cited

U.S. PATENT DOCUMENTS

| | | | | |
|---|---|---|---|---|
| 7,288,754 B2 * | 10/2007 | Tsai | ................... | H04B 10/6973 |
| | | | | 330/202 |
| 10,763,807 B2 * | 9/2020 | Welch | ................. | H03F 3/45071 |
| 11,336,236 B2 * | 5/2022 | Lambrecht | .......... | H03F 3/45663 |

FOREIGN PATENT DOCUMENTS

| | | | | |
|---|---|---|---|---|
| CN | 109039473 B | * | 5/2020 | ............. H04B 10/69 |

OTHER PUBLICATIONS

Machine translation of CN109039473B (Year: 2020).*

* cited by examiner

*Primary Examiner* — Seung C Sohn

(57)     ABSTRACT

An integrated circuit is disclosed. The integrated circuit comprises an input interface and an optical receiver. The optical receiver includes a photodiode, level shifter, and differential transimpedance amplifier (TIA). The photodiode has a cathode and anode terminal and is configured to receive an optical signal via the input interface. The level shifter includes a parallel RC circuit. The differential TIA has first and second conversion circuits. The first conversion circuit is connected to the cathode terminal and a first output terminal of the optical receiver. The second conversion circuit is connected between the anode terminal and a second output terminal of the optical receiver. The parallel RC circuit is connected between the cathode terminal of the photodiode and the first conversion circuit. The differential TIA is configured to provide a differential voltage signal at the first and second output terminals of the optical receiver based on the optical signal.

23 Claims, 5 Drawing Sheets

DIFFERENTIAL TRANSIMPEDANCE AMPLIFIER FROM A SINGLE PHOTODIODE

TECHNICAL FIELD

This application is directed, in general, to optical receivers and, more specifically, to increasing an optical signal received at optical receivers.

BACKGROUND

Optical to electrical communications is typically handled by implementing one or more types of photodiodes when implemented as an interface to an integrated circuit, or as part of an integrated circuit. Transimpedance amplifiers (TIAs) are used in optical receivers to convert photodiode current from received optical signals into a voltage. TIAs are inherently single ended circuits requiring a single-ended to differential conversion to be implemented at a later stage.

SUMMARY OF THE DISCLOSURE

In one aspect, an optical receiver is disclosed. In one embodiment, the optical receiver comprises a photodiode, a level shifter, and a differential transimpedance amplifier (TIA). In one embodiment, the photodiode has a cathode terminal and an anode terminal. In one embodiment, the level shifter includes a parallel RC circuit. In one embodiment, the differential TIA has a first conversion circuit connected to the level shifter and a first output terminal of the optical receiver. In one embodiment, the parallel RC circuit of the level shifter is connected between the cathode terminal of the photodiode and the first conversion circuit.

In another aspect, an optical-electrical apparatus is disclosed. In one embodiment, the optical-electrical apparatus comprises a photodiode, a cathode biasing circuit, and a differential transimpedance amplifier (TIA). In one embodiment, the photodiode has an anode terminal and a cathode terminal. In one embodiment, the cathode biasing circuit is connected to the cathode terminal of the photodiode. In one embodiment, the differential TIA is configured to receive, at a first input terminal, a current from the cathode terminal of the photodiode and is configured to convert the received current to a first output voltage. In one embodiment, the cathode biasing circuit is configured to bias the cathode terminal of the photodiode at a high operating voltage and configured to provide an impedance greater than a combined impedance of an impedance at the first input terminal and a level shifter connected between the cathode terminal of the photodiode and the first input terminal.

In another aspect, an integrated circuit is disclosed. In one embodiment, the integrated circuit comprises an input interface and an optical receiver. In one embodiment, the optical receiver includes a photodiode, a level shifter, and a differential transimpedance amplifier (TIA). In one embodiment, the photodiode has a cathode terminal and an anode terminal and is configured to receive an optical signal via the input interface. In one embodiment, the level shifter includes a parallel RC circuit. In one embodiment, the differential TIA has a first conversion circuit and a second conversion circuit. In one embodiment, the first conversion circuit is connected to the cathode terminal of the photodiode and a first output terminal of the optical receiver. In one embodiment, the second conversion circuit is connected between the anode terminal of the photodiode and a second output terminal of the optical receiver. In one embodiment, the parallel RC circuit is connected between the cathode terminal of the photodiode and the first conversion circuit. In one embodiment, the differential TIA is configured to provide a differential voltage signal at the first and second output terminals of the optical receiver based on the optical signal.

In another aspect, a library of circuit designs is disclosed. In one embodiment, the library of circuit designs comprises an optical receiver, the optical receiver comprising a photodiode, a level shifter, and a differential transimpedance amplifier. In one embodiment, the photodiode has a cathode terminal and an anode terminal. In one embodiment, the level shifter includes a parallel RC circuit. In one embodiment, the differential TIA has a first conversion circuit connected to the level shifter and a first output terminal of the optical receiver. In one embodiment, the parallel RC circuit is connected between the cathode terminal of the photodiode and the first conversion circuit.

BRIEF DESCRIPTION OF THE DRAWINGS

Reference is now made to the following descriptions taken in conjunction with the accompanying drawings, in which.

DETAILED DESCRIPTION

Current from an anode terminal of a photodiode is usually provided to a TIA for conversion to a single-ended voltage. Even though a same photodiode current is flowing through a cathode terminal of the photodiode, using current through the cathode terminal of the photodiode for optical-to-electrical conversion is challenging, e.g., to provide a differential voltage rather than a single-ended voltage. One challenge is the need for the photodiode to have a large reverse bias voltage across it for the photodiode to operate at high speeds. Accordingly, this requires the cathode terminal to be biased to a high voltage (e.g., 2 volts DC). Unfortunately, the input DC voltage for a TIA is typically low (e.g., half the TIA supply voltage which could be in, e.g., in the 400 mV-500 mV range). Another challenge for using current through the cathode terminal of the photodiode is that as much of the photodiode current flowing from the cathode terminal of the photodiode as possible needs to flow into a cathode side of the TIA, and not the circuit that is used to bias the cathode terminal of the photodiode. Thus, this other challenge is that circuit that provides the reverse bias voltage applied to the cathode terminal of the photodiode should have high impedance.

The disclosure provides an optical receiver that advantageously meets the challenges noted above and also provides a differential voltage output signal. The disclosed optical receiver biases the cathode terminal at a high voltage, such as the high operating voltage of the optical receiver. The disclosed optical receiver also provides a cathode biasing circuit that biases the cathode terminal with a higher impedance than the impedance looking into the circuitry connected to the cathode terminal of the photodiode, e.g., a cathode-side input of the TIA. Additionally, the disclosed optical receiver performs broadband level shifting from the cathode voltage at the cathode terminal (a higher voltage) to the cathode-side input terminal of the TIA (a lower voltage). Advantageously, the optical receiver provides a differential output signal with a single photodiode and a single differential TIA.

Additionally, compared to conventional optical receivers, a signal-to-noise ratio (SNR) of the disclosed optical receiver, e.g., representing a sensitivity of the optical receiver, can be improved by a factor of approximately the square root of two, or upwards of a 40% improvement in SNR.

Figure 1:
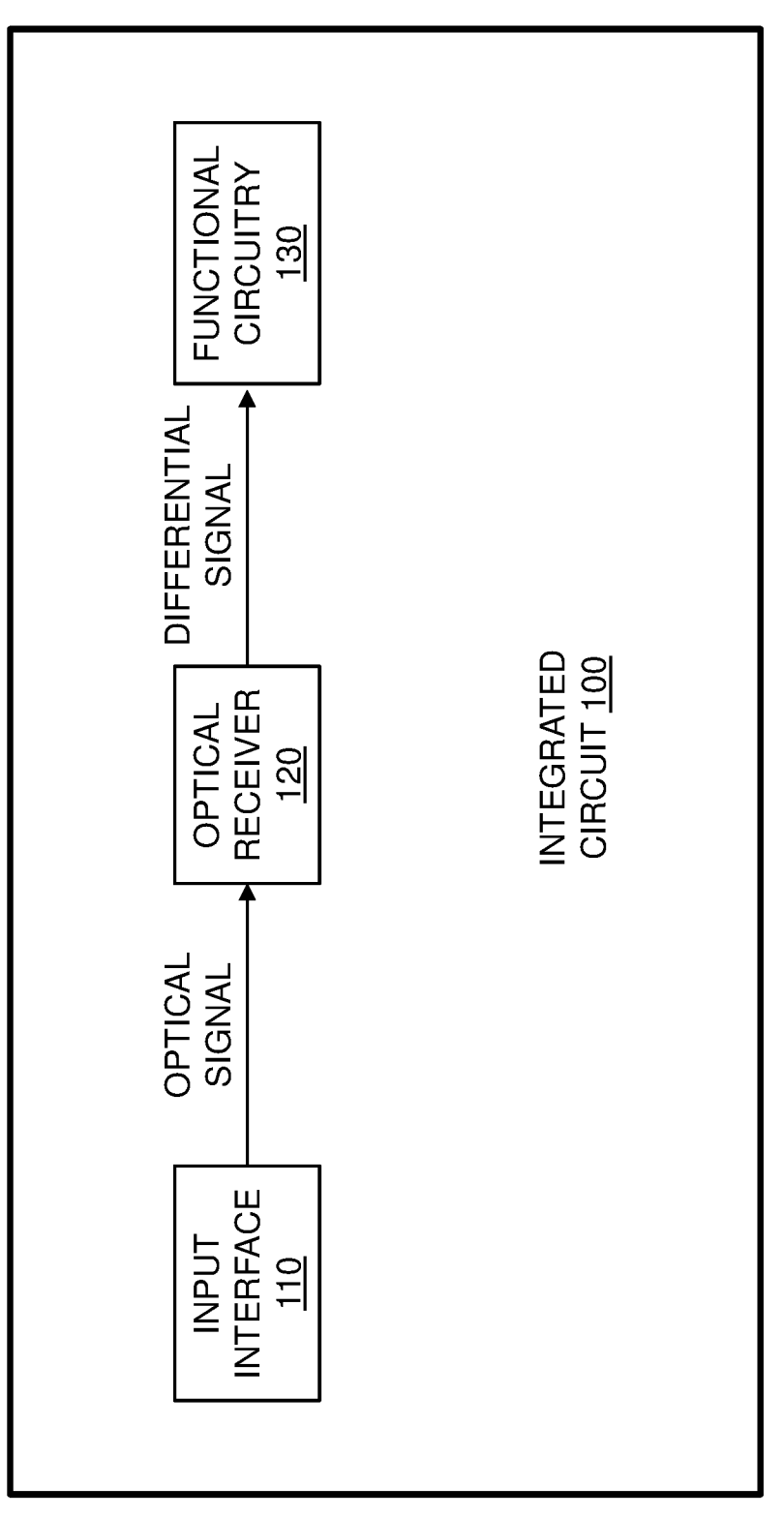
FIG. 1 illustrates a block diagram of an integrated circuit having an example of an optical receiver constructed according to the principles of the disclosure.

Referring to the drawings, specifically FIG. 1, a block diagram of an integrated circuit 100 having an example of an optical receiver constructed according to the principles of the disclosure is shown. Integrated circuit 100 includes input interface 110, optical receiver 120, and functional circuitry 130. Typically, an optical fiber (not shown) is connected to input interface 110, which passes an optical signal carried on the optical fiber to optical receiver 120. Optical receiver 120 converts the optical signal from input interface 110 into a differential voltage signal representative of the optical signal. The differential voltage signal is output from optical receiver 120 and applied to functional circuitry 130, which uses the differential voltage signal.

Figure 2:
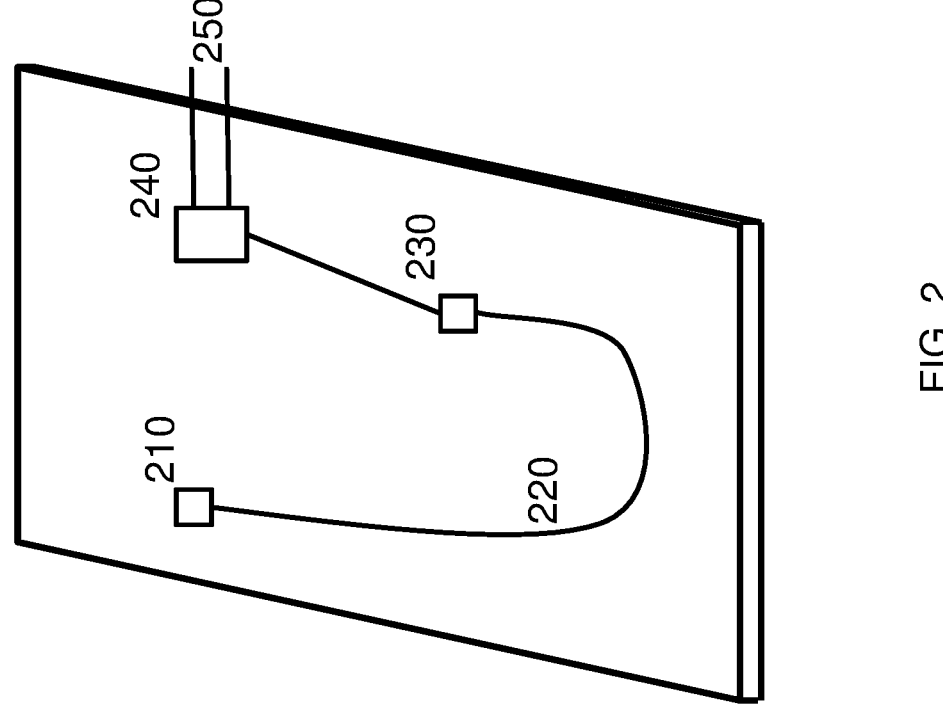
FIG. 2 illustrates a circuit diagram of an example of an integrated circuit having an optical receiver constructed according to principles of the disclosure.
Figure 2:
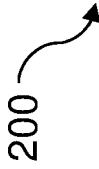

FIG. 2 illustrates a circuit diagram 200 of an example of an integrated circuit having an optical receiver constructed according to principles of the disclosure. Circuit diagram 200 includes input interface 210, optical link 220, photodiode 230, differential TIA 240, and differential voltage output 250. Typically, an optical fiber (not shown) is connected to input interface 210. An optical signal carried on the optical fiber is passed through input interface 210 and then through optical link 220 to photodiode 230. Then differential TIA 240 converts the optical signal to a differential voltage which is applied at differential voltage output 250. The differential voltage can be applied to another integrated circuit via the differential voltage output 250.

Figure 3:
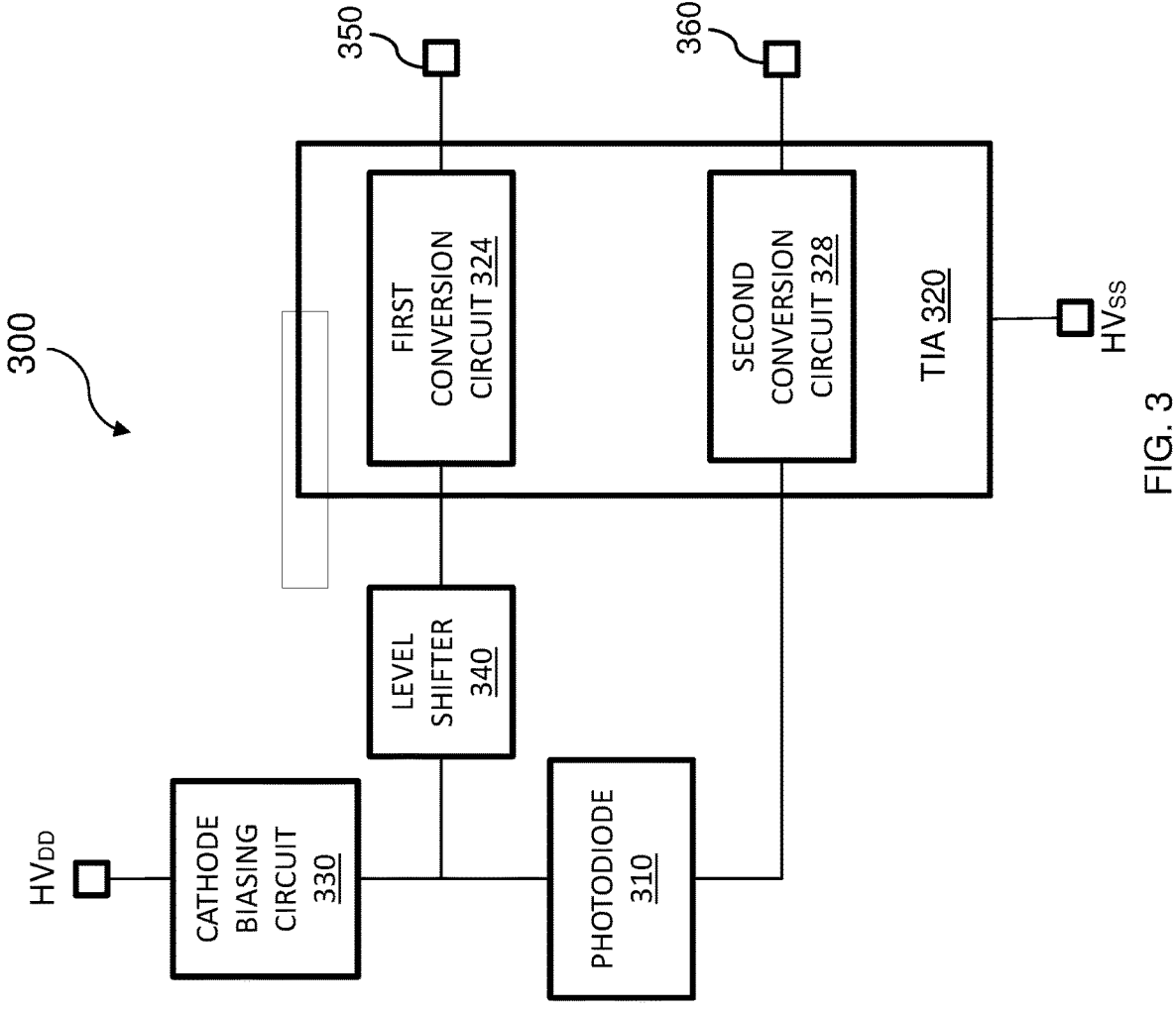
FIG. 3 illustrates a block diagram of an example of an optical receiver constructed according to the principles of the disclosure.

FIG. 3 illustrates a block diagram of an example of an optical receiver 300 constructed according to principles of the disclosure. Optical receiver 300 includes photodiode 310, differential TIA 320, cathode biasing circuit 330, level shifter 340, and differential voltage signal outputs 350, 360. Differential TIA 320 includes first conversion circuit 324 and second conversion circuit 328. A high voltage supply voltage, e.g., $HV_{DD}$, is applied to cathode biasing circuit 330. Cathode biasing circuit 330 provides the high voltage bias described above to reverse bias photodiode 310 so that photodiode 310 converts an optical signal applied thereto into a photodiode current. Cathode biasing circuit 330 also shows an impedance to photodiode 310 that is much greater (by at least a factor of 10 across all frequencies of interest) than an impedance level shifter 340 presents to photodiode 310, allowing a preponderance of the photodiode current exiting a cathode terminal of photodiode 310 to continue to level shifter 340 rather than cathode biasing circuit 330.

Level shifter 340 shifts the signal level from the cathode terminal of photodiode 310 to a signal level usable by differential TIA 320. Photodiode current from the cathode terminal of photodiode 310 that has been shifted by level shifter 340 is applied to first conversion circuit 324 of differential TIA 320. Photodiode current from an anode terminal of photodiode 310 is applied to second conversion circuit 328 of differential TIA 320. A low voltage supply, e.g., $LV_{DD}$, is applied to differential TIA 320. An output of first conversion circuit 324 is applied to differential voltage output 350 and an output of second conversion circuit 328 is applied to differential voltage output 360. The differential voltage signal output at differential voltage outputs 350, 360 represents a differential signal representative of the optical signal applied to photodiode 310 with a significantly improved SNR value of approximately 40% (compared to conventional single-ended TIAs). Differential voltage outputs 350, 360, can correspond to, for example, differential voltage output 250 of FIG. 2 and/or a differential voltage output of optical receiver 120 of FIG. 1. Because of losses in signals caused by level shifter 340 and additional noise produced by cathode biasing circuit 330, the theoretical SNR improvement of the square root of two (or approximately 40%) cannot be realized. However, the losses generated by level shifter 340 and the additional noise produced by cathode biasing circuit 330 are small enough that the overall SNR improvement approaches 40%.

Figure 4:
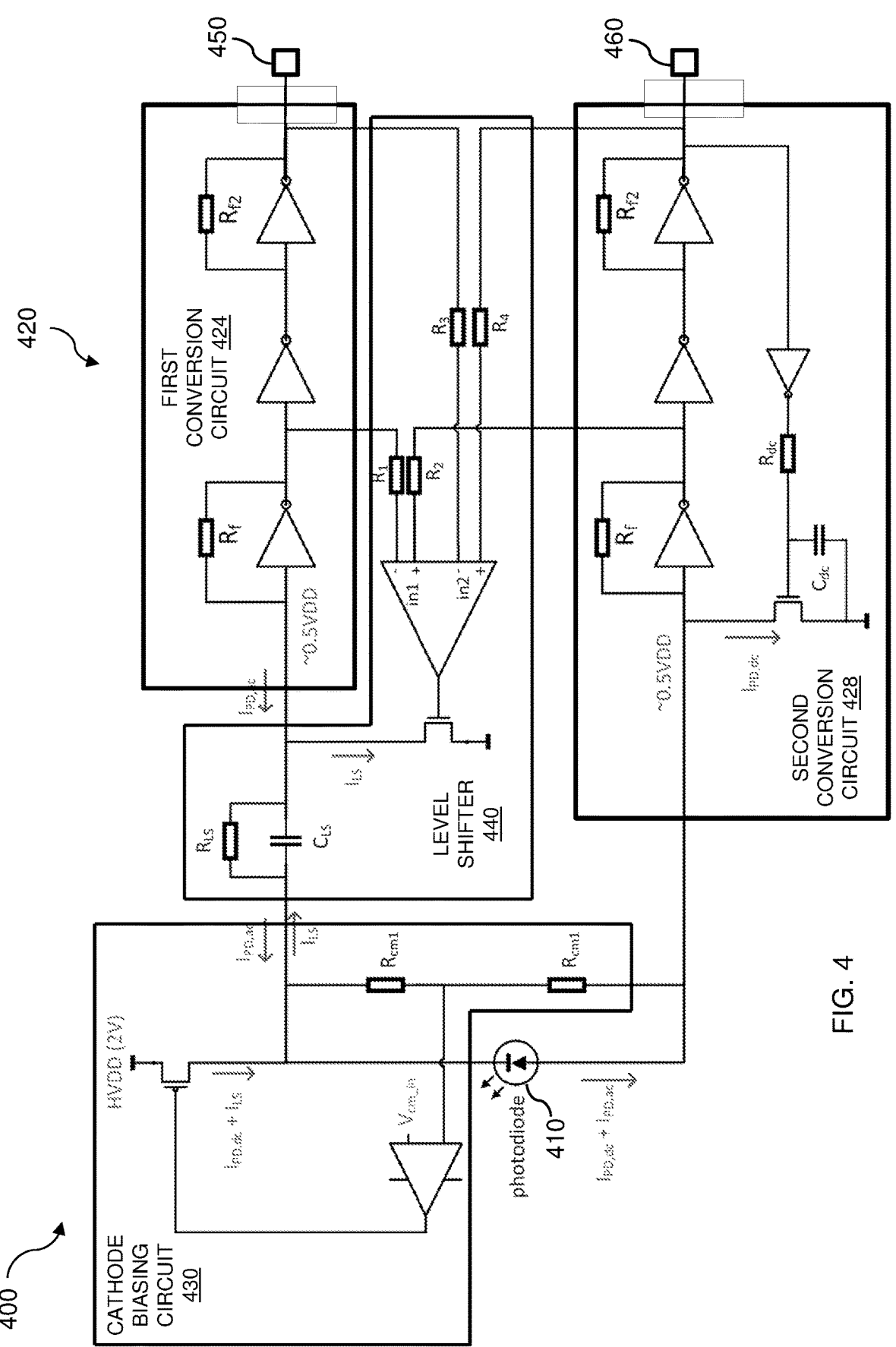
FIG. 4. illustrates a schematic diagram of an example of an optical receiver constructed according to the principles of the disclosure.

FIG. 4. illustrates a schematic diagram of an example of an optical receiver 400 constructed according to the principles of the disclosure. As with the block diagram of optical receiver in FIG. 3, schematic diagram of the optical receiver 400 includes similarly numbered photodiode 410, differential TIA 420, cathode biasing circuit 430, level shifter 440, and differential voltage signal outputs 450, 460. Differential TIA 420 includes first conversion circuit 424 and second conversion circuit 428. Current passing through photodiode 410 includes both a DC component, e.g., a DC current $I_{PD,dc}$ from the reverse bias voltage provided by cathode biasing circuit 430 and an AC current $I_{PD,ac}$ from first conversion circuit 424 (whose corresponding voltage level has been shifted by level shifter 440). Photodiode 410 sees a high impedance from cathode biasing circuit 430 primarily due to a PMOS transistor of cathode biasing circuit 430.

Cathode biasing circuit 430 also includes a pair of common mode resistors $R_{CM1}$, $R_{CM2}$ and a common mode operational transconductance amplifier (OTA) which has a voltage generated between the pair of common mode resistors $R_{CM1}$, $R_{CM2}$ applied to one of its inputs and a common mode voltage $V_{cm\_in}$ applied to another of its inputs. The output of this OTA amp controls the gate of the PMOS transistor which, when turned on, reverse biases photodiode 410 with a voltage significant enough to allow current passing through photodiode 410 to respond to changing light impinging on photodiode 410. In some embodiments, the pair of common mode resistors $R_{CM1}$, $R_{CM2}$ are used to sense an input common mode voltage at the cathode and anode terminals of photodiode 410. In some embodiments, the voltage provided by cathode biasing circuit 430 is twice a common mode voltage reference less an anode terminal bias voltage. In some embodiments, cathode biasing circuit 430 provides a voltage to the cathode terminal of photodiode 410 with a current source. Of course, other circuitry configurations could be used to provide the voltage to properly bias photodiode 410, however, any such circuitry should provide a sufficiently high impedance to photodiode 410 such that the AC current component of current from the cathode of the photodiode will pass to the level shifter and not the cathode biasing circuitry.

First conversion circuit 424 converts an AC current flowing into the cathode terminal of photodiode 410, e.g., $I_{PD,ac}$, into one side of a differential voltage representing the current flowing through photodiode 410 presented at one of the differential voltage signal output, e.g., differential voltage signal output 450. An example of circuitry to perform the current to voltage conversion of the AC current flowing into the cathode terminal of photodiode 410, $I_{PD,ac}$, as depicted in first conversion circuit 424 of FIG. 4, includes three inverter stages connected in series with first and second feedback resistors, $R_f$ and $R_{f2}$, connected in feedback to first and third stage inverters of the three inverter stages of first conversion circuit 424. Of course, other circuitry configurations could be used to perform this current to voltage conversion.

However, it is necessary to shift the voltage level corresponding to $I_{PD,ac}$ to be centered at about 0.5 times the supply voltage, e.g., $V_{DD}$, to first conversion circuit 424. This voltage level shifting is performed by level shifter 440. In level shifter 440 of FIG. 4, shifting of the voltage level corresponding to $I_{PD,ac}$ to be centered at about $0.5V_{DD}$ is performed by the RC circuit shown in level shifter 440 comprising, e.g., resistor $R_{LS}$ and capacitor $C_{LS}$. Of course, other circuitry could be used to shift this voltage.

In addition to the current flowing into photodiode 410, e.g., $I_{PD,ac}$, from first conversion circuit 424, another current component flows into level shifter 440 through the RC circuit (e.g., $R_{LS}/C_{LS}$) from cathode biasing circuit 430, e.g., $I_{LS}$, that should be removed in order for first conversion circuit 424 to be able to accurately convert $I_{PD,ac}$ into the one side of the differential voltage presented at differential voltage signal output 450. In one embodiment, this current, e.g., $I_{LS}$, is dumped through an output NMOS transistor in a sensing loop forming, e.g., a current dump configured to control the current, e.g., $I_{LS}$, from cathode biasing circuit 430. This output NMOS transistor is controlled by a voltage applied at its gate which is generated by a sensing operational transconductance amplifier (OTA) in the sensing loop as shown in level shifter 440 of FIG. 4.

In one embodiment, a negative input for one input of an input pair of this OTA, e.g., $in_1-$, is provided by a signal after the first stage inverter of the three inverter stages of first conversion circuit 424 through a first resistor, e.g., $R_1$, and a positive input for this input of this input pair of this OTA, e.g., $in_1+$, is provided by a signal after the first stage inverter of three inverter stages of second conversion circuit 428 through a second resistor, e.g., $R_2$. In this embodiment of level shifter 440 of FIG. 4, another input pair for this OTA, e.g., $in_2+$ and $in_2-$, is used to also control the output NMOS transistor and inputs to this other input pair of this OTA, e.g., $in_2+$ and $in_2-$, are provided by signals as will be described below. In other embodiments, only the first input pair, e.g., input pair $in_1$, or only the second input pair, e.g., $in_2$, of this OTA of level shifter 440 of FIG. 4 may be used to control the output NMOS transistor. Based on these signals to this OTA, the output NMOS transistor is turned on to allow this other current component flowing into level shifter 440, e.g., $I_{LS}$, to be directed to ground. Of course, other circuitry could be implemented to handle this current, e.g., $I_{LS}$.

Second conversion circuit 428 converts an AC current flowing from the anode terminal of photodiode 410, e.g., $I_{PD,ac}$, into another side of the differential voltage representing the current flowing through photodiode 410 presented at the other of the differential voltage signal output, e.g., differential voltage signal output 460. Similar to the circuitry of first conversion circuit 424, an exemplary embodiment of circuitry to perform the current to voltage conversion of the AC current flowing from the anode terminal of photodiode 410, $I_{PD,ac}$, as depicted in second conversion circuit 428 of FIG. 4, also includes three inverter stages connected in series with first and second feedback resistors, $R_f$ and $R_{f2}$, connected in feedback to the first and third stage inverters of the three inverter stages in series. Of course, other circuitry configurations could be used to perform this current to voltage conversion.

In one embodiment, signals to input $in_2$ of the op amp of level shifter 440 used to control the NMOS transistor of level shifter 440 (to dump $I_{LS}$). In this embodiment, a negative input for $in_2$ of this op amp, e.g., $in_2-$, is provided by a signal after the third inverter of the of the three inverter stages of first conversion circuit 428 through a third resistor, e.g., $R_3$, and a positive input for $in_2$ of this op amp, e.g., $in_2+$, is provided by a signal after the third inverter of the three inverter stages of second conversion circuit 428 through a fourth resistor, e.g., $R_4$. Of course, other circuitry configurations could be used to provide these signals to the op amp of level shifter 440.

The DC current component through photodiode 410, e.g., $I_{PD,dc}$, generated by cathode biasing circuit 430 as described above is input into second conversion circuit 428 and should be removed in order for second conversion circuit 428 to be able to accurately convert $I_{PD,ac}$ from the anode terminal of photodiode 410 presented at the other of the differential voltage signal output, e.g., differential voltage signal output 460. In optical receiver 400, $I_{PD,dc}$ is removed using the NMOS transistor shown in second conversion circuit 428. In this embodiment, a capacitor, e.g., capacitor $C_{dc}$, is placed between a gate and drain of this NMOS transistor and a signal from the third op amp of second conversion circuit 428 (described above) is fed back through an op amp, e.g., the op amp shown in second conversion circuit 428, and a resistor, e.g., resistor $R_{dc}$ of second conversion circuit 428, to control the gate of this NMOS transistor, such that when this signal is applied to the gate of this NMOS transistor, the NMOS transistor will turn on allowing this current flowing into second conversion circuit 428, e.g., $I_{PD,ac}$ to be directed to ground.

Thus, the example of the optical receiver 400, unlike a conventional optical receiver employing a single-ended transimpedance amplifier using just the current from an anode of a photodiode, uses both current of a cathode terminal of a photodiode, e.g., photodiode 410, and current from an anode terminal of the photodiode, e.g., photodiode 410, to provide a differential voltage signal, e.g., at differential voltage signal outputs 450 and 460, representative of a current passing through the photodiode, e.g., photodiode 410, where an amount of the current passing through the photodiode corresponds to an amount of light impinging on the photodiode. This example of the optical receiver 400 is much more sensitive than the conventional optical receiver employing the single-ended transimpedance amplifier, typically on the order of approximately 40% (square root of two). Furthermore, since optical receiver 400 already provides a differential voltage signal representative of current passing through a photodiode, no single-ended to differential conversion is needed.

Figure 5:
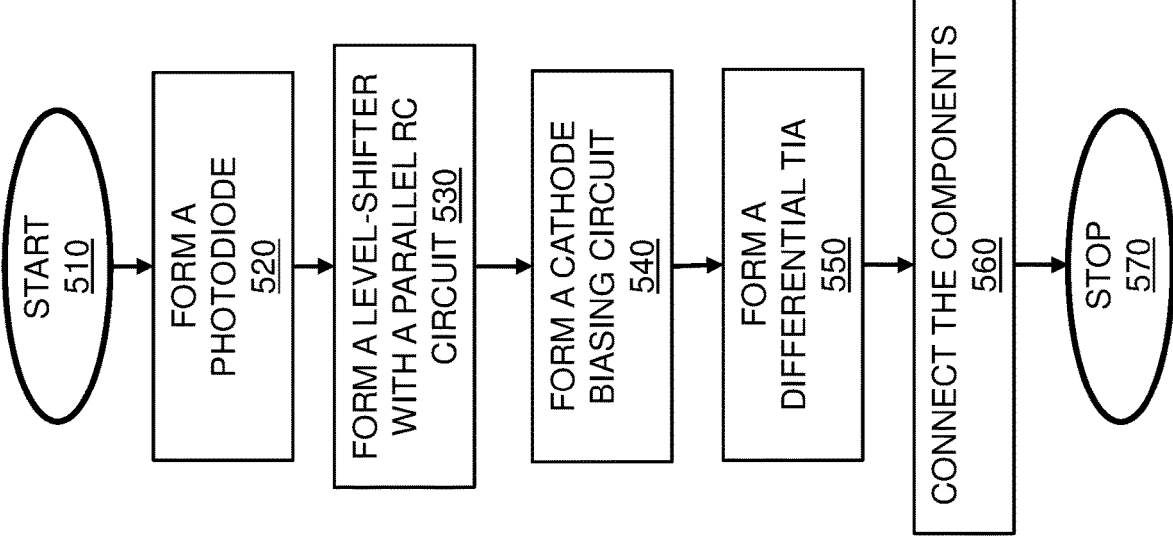
FIG. 5 illustrates a flow diagram of an example of a method of constructing an optical receiver carried out according to the principles of the disclosure.

FIG. 5 illustrates a flow diagram 500 of an example of a method of constructing an optical receiver carried out according to the principles of the disclosure. This method starts at step 510. At step 520, a photodiode is formed, e.g., photodiode 410 of FIG. 4. At step 530, a level shifter with a parallel RC circuit is formed, e.g., level shifter 440 of FIG. 4. At step 540, a cathode biasing circuit is formed, e.g., cathode biasing circuit 430 of FIG. 4. At step 550, a differential TIA is formed, e.g., differential TIA 420 of FIG. 4. At step 560, these components are connected, e.g., as depicted in FIG. 4. The method ends at step 550.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/ or read-only memory (ROM), to enable various types of digital data processors or computers to perform one, multiple or all of the steps of one or more of the above-described methods, or functions, systems or apparatuses described herein. The data storage media can be part of or associated with the digital data processors or computers.

The digital data processors or computers can be comprised of one or more GPUs, one or more CPUs, one or more of other processor types, or a combination thereof. The digital data processors and computers can be located proximate each other, proximate a user, in a cloud environment, a data center, or located in a combination thereof. For example, some components can be located proximate the user and some components can be located in a cloud environment or data center.

The GPUs can be embodied on a single semiconductor substrate, included in a system with one or more other devices such as additional GPUs, a memory, and a CPU. The GPUs may be included on a graphics card that includes one or more memory devices and is configured to interface with a motherboard of a computer. The GPUs may be integrated GPUs (iGPUs) that are co-located with a CPU on a single chip. Configured or configured to means, for example, designed, constructed, or programmed, with the necessary logic and/or features for performing a task or tasks.

Portions of disclosed examples or embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floppy disks; and hardware devices that are specially configured to store and execute program code, such as ROM and RAM devices. Configured or configured to means, for example, designed, constructed, or programmed, with the necessary logic and/or features for performing a task or tasks. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

What is claimed is:

1. An optical receiver, comprising:
a photodiode having a cathode terminal and an anode terminal;
a level shifter including a parallel RC circuit; and
a differential transimpedance amplifier having:
a first conversion circuit connected to the level shifter and a first output terminal of the optical receiver, wherein the parallel RC circuit is connected between the cathode terminal and the first conversion circuit; and
a second conversion circuit connected between the anode terminal and a second output terminal of the optical receiver, wherein the first and the second conversion circuits are different circuits and the first and the second output terminals are separate terminals, wherein the level shifter further includes a sensing loop having a sensing operational transconductance amplifier (OTA) and an output transistor, wherein either a first input terminal pair of the sensing OTA is connected to negative terminals of the first and the second conversion circuit, a second input terminal pair of the sensing OTA is connected to positive terminals of the first and the second conversion circuit, or both and an output of the OTA is connected to a gate of the output transistor.

2. The optical receiver as recited in claim 1, further comprising a cathode biasing circuit connected between the cathode terminal and a high operating voltage of the optical receiver.

3. The optical receiver as recited in claim 2, wherein the cathode biasing circuit includes at least one resistor connected between the cathode terminal and the anode terminal.

4. The optical receiver as recited in claim 3, wherein the cathode biasing circuit further includes a common-mode loop connected to the at least one resistor, wherein the common-mode loop includes a common-mode operational transconductance amplifier (OTA) and a transistor, wherein an output terminal of the common-mode OTA is connected to a gate of the transistor, which provides DC current for the photodiode.

5. The optical receiver as recited in claim 4, wherein the cathode biasing circuit includes two resistors connected in series between the cathode terminal and the anode terminal, and an input terminal of the common-mode OTA is connected to a node between the two resistors.

6. An optical-electrical apparatus, comprising:
a photodiode having an anode terminal and a cathode terminal;
a cathode biasing circuit connected to the cathode terminal; and
a differential transimpedance amplifier configured to receive, at a first input terminal, a current from the cathode terminal and convert the received current to a first output voltage, wherein the cathode biasing circuit is configured to bias the cathode terminal at a high operating voltage of the optical-electrical apparatus and provide an impedance greater than a combined impedance of an impedance at the first input terminal and at a level shifter connected between the cathode terminal and the first input terminal, wherein the level shifter: is configured to shift a cathode terminal voltage at the cathode terminal to a lower input voltage at the first input terminal; and includes a parallel RC circuit and a current dump circuit configured to control a current through a resistor of the parallel RC circuit to shift the cathode terminal voltage to the lower input voltage at the first input terminal.

7. The optical-electrical apparatus as recited in claim 6, wherein the differential transimpedance amplifier is further configured to receive, at a second input terminal, a current from the anode terminal and convert the received current to a second output voltage.

8. The optical-electrical apparatus as recited in claim 6, wherein the current dump circuit is configured to control the current through the resistor of the parallel RC circuit based on DC voltages at the first input terminal and a second input terminal of the differential transimpedance amplifier.

9. The optical-electrical apparatus as recited in claim 6, wherein the cathode biasing circuit includes at least two resistors connected in series between the cathode terminal and the anode terminal that are used to sense an input common mode voltage at the cathode and anode photodiode terminals.

10. The optical-electrical apparatus as recited in claim 9, wherein the at least two resistors feed a common-mode loop that determines a common-mode voltage between the cathode and anode terminals of the photodiode and the cathode biasing circuit sets the cathode terminal voltage to be twice a common-mode voltage reference minus an anode terminal bias voltage.

11. The optical-electrical apparatus as recited in claim 10, wherein the cathode biasing circuit further includes a current source connected to the cathode terminal which provides a needed DC current for the photodiode plus a DC current for the level shifter.

12. A method of manufacturing an optical receiver as recited in claim 6.

13. An integrated circuit, comprising:

input interface; and an optical receiver including:

a photodiode, having a cathode terminal and an anode terminal, configured to receive an optical signal via the input interface;

a level shifter including a parallel RC circuit; and a differential transimpedance amplifier having a first conversion circuit connected to the cathode terminal and a first output terminal of the optical receiver and a second conversion circuit connected between the anode terminal and a second output terminal of the optical receiver, wherein the parallel RC circuit is connected between the cathode terminal and the first conversion circuit and the differential transimpedance amplifier is configured to provide a differential voltage signal at the first and second output terminal based on the optical signal, wherein the level shifter further includes a sensing loop having a sensing operational transconductance amplifier (OTA) and an output transistor, wherein either a first input terminal pair of the sensing OTA is connected to negative terminals of the first and the second conversion circuit, a second input terminal pair of the sensing OTA is connected to positive terminals of the first and the second conversion circuit, or both and an output of the OTA is connected to a gate of the output transistor.

14. The integrated circuit as recited in claim 13, further comprising functional circuitry connected to the first and second output terminals that generate an output based on the differential voltage signal.

15. The integrated circuit as recited in claim 13, further comprising a cathode biasing circuit connected between the cathode terminal and a high operating voltage of the optical receiver.

16. The optical receiver as recited in claim 15, wherein the cathode biasing circuit includes at least one resistor connected between the cathode terminal and the anode terminal.

17. The optical receiver as recited in claim 16, wherein the cathode biasing circuit further includes a common-mode loop connected to the at least one resistor, wherein the common-mode loop includes a common-mode operational transconductance amplifier (OTA) and a transistor, wherein an output terminal of the common-mode OTA is connected to a gate of the transistor, which provides DC current for the photodiode.

18. The optical receiver as recited in claim 17, wherein the cathode biasing circuit includes two resistors connected in series between the cathode terminal and the anode terminal, and an input terminal of the common-mode OTA is connected to a node between the two resistors.

19. A library of circuit designs, comprising:

an optical receiver, the optical receiver comprising:

a photodiode having a cathode terminal and an anode terminal;

a level shifter including a parallel RC circuit; and a differential transimpedance amplifier having:

a first conversion circuit connected to the level shifter and a first output terminal of the optical receiver, wherein the parallel RC circuit is connected between the cathode terminal and the first conversion circuit; and a second conversion circuit connected between the anode terminal and a second output terminal of the optical receiver, wherein the first and the second conversion circuits are different circuits and the first and the second output terminals are separate terminals, wherein the level shifter of the optical receiver further includes a sensing loop having a sensing operational transconductance amplifier (OTA) and an output transistor, wherein either a first input terminal pair of the sensing OTA is connected to negative terminals of the first and the second conversion circuit, a second input terminal pair of the sensing OTA is connected to positive terminals of the first and the second conversion circuit, or both and an output of the OTA is connected to a gate of the output transistor.

20. The library of circuit designs as recited in claim 19, wherein the optical receiver further comprises a cathode biasing circuit connected between the cathode terminal and a high operating voltage of the optical receiver.

21. The library of circuit designs as recited in claim 20, wherein the cathode biasing circuit of the optical receiver includes at least one resistor connected between the cathode terminal and the anode terminal.

22. The library of circuit designs as recited in claim 21, wherein the cathode biasing circuit of the optical receiver further includes a common-mode loop connected to the at least one resistor, wherein the common-mode loop includes a common-mode operational transconductance amplifier (OTA) and a transistor, wherein an output terminal of the common-mode OTA is connected to a gate of the transistor, which provides DC current for the photodiode.

23. The library of circuit designs as recited in claim 22, wherein the cathode biasing circuit of the optical receiver includes two resistors connected in series between the cathode terminal and the anode terminal, and an input terminal of the common-mode OTA is connected to a node between the two resistors.

* * * * *